United States Patent
Albert et al.

(10) Patent No.: US 10,160,327 B2
(45) Date of Patent: Dec. 25, 2018

(54) SYSTEM AND METHOD FOR ASSISTING THE START OF AN ELECTRICALLY POWERED VEHICLE

(71) Applicant: Fico Triad, S.A., Barcelona (ES)

(72) Inventors: Adriá Torná Albert, Barcelona (ES); Enric Sala Masip, Manresa (ES)

(73) Assignee: FICO TRIAD, S.A., Barcelona (ES)

( * ) Notice: Subject to any disclaimer, the term of this patent is extended or adjusted under 35 U.S.C. 154(b) by 57 days.

(21) Appl. No.: 15/271,814

(22) Filed: Sep. 21, 2016

(65) Prior Publication Data

US 2017/0080804 A1 Mar. 23, 2017

(30) Foreign Application Priority Data

Sep. 22, 2015 (EP) ..................... 15382457

(51) Int. Cl.
*B60L 3/00* (2006.01)
*G01R 27/02* (2006.01)
*G01R 31/02* (2006.01)
*B60L 11/12* (2006.01)
*G01R 31/00* (2006.01)

(52) U.S. Cl.
CPC ........... *B60L 3/0069* (2013.01); *B60L 3/0046* (2013.01); *B60L 11/126* (2013.01); *G01R 27/025* (2013.01); *G01R 31/025* (2013.01); *B60L 2240/547* (2013.01); *B60L 2240/80* (2013.01); *B60L 2260/26* (2013.01); *G01R 31/007* (2013.01); *Y02T 10/6217* (2013.01); *Y02T 10/7005* (2013.01); *Y02T 10/7077* (2013.01)

(58) Field of Classification Search
CPC .... B60L 3/0069; B60L 3/0046; B60L 11/126; G01R 27/025; G01R 31/025
See application file for complete search history.

(56) References Cited

U.S. PATENT DOCUMENTS

2007/0008666 A1* 1/2007 Morita ................. B60L 3/0023
361/42

* cited by examiner

*Primary Examiner* — Michael D Lang
(74) *Attorney, Agent, or Firm* — Cantor Colburn LLP (57) ABSTRACT

A system and method for assisting the start of an electrically powered vehicle comprising a battery and processing means configured to: a) receive a sequence of voltage measurements by a sensor connected between the high voltage terminals of the battery and a chassis, b) compare the sequence of voltage measurements received from the sensor with previously established voltage patterns, wherein each voltage pattern is formed by a sequence of voltage values, and wherein each voltage pattern is associated to an insulation resistance value, c) select the voltage pattern whose voltage values are closest to the voltage values of the sequence of voltage measurements received from the sensor, d) establish the insulation resistance value of the battery from selected voltage pattern, and e) enable starting of the vehicle if the insulation resistance value obtained exceeds a predetermined insulation resistance threshold value that ensures the insulation of the battery.

10 Claims, 6 Drawing Sheets

SYSTEM AND METHOD FOR ASSISTING THE START OF AN ELECTRICALLY POWERED VEHICLE

CROSS-REFERENCES TO RELATED APPLICATIONS

This patent application claims priority to European Application No. EP15382457.8, filed Sep. 22, 2015 which is incorporated herein by reference in its entirety.

BACKGROUND OF THE INVENTION

The present invention relates to a new system and method for assisting the start of an electrically powered vehicle. More particularly, the invention relates to a system and method configured to obtain the insulation resistance value of the vehicle battery.

Improving safety and comfort is always a concern in the automotive industry. For electrically powered vehicles, such as electric or hybrid powered vehicles, insulation of the high voltage battery is of significant importance to guarantee safety of the entire vehicle and its occupants. For that, electrically powered vehicles demand applications that check whether the insulation level of the battery is adequate or not before performing specific tasks, such as starting the vehicle.

The start of an electrically powered vehicle is a potentially dangerous task and could pose a risk for the occupants, or even the vehicle itself, if the battery is poorly insulated.

For that, before enabling the start of the vehicle, the resistance between the high voltage lines and chassis must be measured. From this measurement, the insulation level of the battery can be determined and starting can be enabled or disabled in consequence.

Currently, there exist commercial sensors capable of providing this measurement. However, on average, sensors of this kind usually require about 2 seconds to obtain a rough measurement and about 20 seconds to obtain a definite value. The 2-second time measurement just provides an indication in the event of very serious isolation fault. Thus, in order to ensure safety in the use of electric vehicles, a driver has to wait a considerable time before the vehicle actually starts. This time corresponds with the time needed by the sensor to obtain the definite insulation resistance value.

This starting delay reduces driving comfort.

Therefore, it would be desirable in the electrically powered vehicle industry to develop an improved system and method that are capable of reducing this vehicle starting delay while ensuring safety of such start.

SUMMARY OF THE INVENTION

The present invention overcomes the above mentioned drawbacks by providing a system that enables a quick start without endangering either the vehicle or the driver.

The invention provides a system and method capable of offering a quick start by reducing the time conventionally required for testing the insulation resistance of the battery.

The present invention also provides a system and method capable of guaranteeing a safe start for both the driver and the vehicle.

The present invention also provides a system and method capable of simplifying obtainment of the insulation resistance value that, at the same time, provides a reliable value.

The invention refers to a system for assisting the start of an electrically powered vehicle that comprises a battery for powering the vehicle, and processing means which are configured to:

a) receive a sequence of voltage measurements ($x_{i0}$, $x_{i1}$, $x_{i2}$, . . . ; $0 \leq i \leq n$) measured by a sensor connected between the high voltage terminals of the battery and a vehicle chassis;

b) compare the sequence of voltage measurements ($x_{i0}$, $x_{i1}$, $x_{i2}$, . . . ; $0 \leq i \leq n$) received from the sensor with previously established voltage patterns (P0, P1, P2, . . . ), wherein each voltage pattern (P0, P1, P2, . . . ) is formed by a sequence of voltage values ($p_{i0}$, $p_{i1}$, $p_{i2}$, . . . ; $0 \leq i \leq n$), and wherein each voltage pattern (P0, P1, P2, . . . ) is associated to an insulation resistance value (Ri; $0 \leq i \leq n$);

c) select the voltage pattern (Pi; $0 \leq i \leq n$) whose voltage values ($p_{i0}$, $p_{i1}$, $p_{i2}$, . . . ; $0 \leq i \leq n$) are closest to the voltage values of the sequence of voltage measurements ($x_{i0}$, $x_{i1}$, $x_{i2}$, . . . $0 \leq i \leq n$) received from the sensor;

d) establish the insulation resistance value (Ri; $0 \leq i \leq n$) associated to the selected voltage pattern (P0, P1, P2, . . . ) as the insulation resistance value of the battery; and e) enable starting of the vehicle if the insulation resistance value obtained exceeds a predetermined insulation resistance threshold value that ensures insulation of the battery.

The invention allows obtaining the insulation resistance value associated to the measurements ($x_{i0}$, $x_{i1}$, $x_{i2}$, . . . ; $0 \leq i \leq n$) obtained by the sensor by just comparing the sensor measurements ($x_{i0}$, $x_{i1}$, $x_{i2}$, . . . ; $0 \leq i \leq n$) with the voltage values ($p_{i0}$, $p_{i1}$, $p_{i2}$, . . . ; $0 \leq i \leq n$) of each one of the patterns (P0, P1, P2, . . . ), and then, selecting the closest pattern to the received measurements.

Providing these patterns, the invention enables obtaining an insulation resistance value quickly, without having to wait for the sensor to obtain a definite value. This waiting is no longer needed since each pattern has an associated insulation resistance value. Thus, the insulation resistance value is obtained by selection of the pattern. Hence, the invention offers a quick start by reducing the delay before starting the vehicle.

Further, patterns avoid having to obtain the insulation resistance value for each particular sequence of voltages obtained by the sensor. The invention equates the sensor voltages ($x_{i0}$, $x_{i1}$, $x_{i2}$, . . . ; $0 \leq i \leq n$) with the voltage values ($p_{i0}$, $p_{i1}$, $p_{i2}$, . . . ; $0 \leq i \leq n$) of the selected pattern. Thus, the possible values of insulation resistance are limited. In this way, the invention simplifies obtaining the insulation resistance value.

Additionally, the invention offers a system with a variable and easily adaptable performance. By just increasing or decreasing the number of patterns, the invention allows modifying accuracy of the insulation resistance value and the time required to obtain it. Increasing the number of provided patterns increases the accuracy of the obtained value but also increases the starting delay, while decreasing the number of provided patterns decreases the starting delay but also decreases the accuracy of the obtained value.

Further, the invention guarantees a safe vehicle starting by evaluating the insulation resistance value with respect to a predetermined resistance threshold. The threshold establishes a minimum desirable resistance between the high voltage terminals of the battery and the chassis. Thus, if the obtained value exceeds the threshold, the starting is enabled, and safe start is guaranteed.

The invention also refers to a method for assisting the start of an electrically powered vehicle, wherein the vehicle comprises a battery and a chassis, wherein the method comprises:

g) receiving a sequence of voltage measurements ($x_{i0}$, $x_{i1}$, $x_{i2}$, ...; $0 \leq i \leq n$) measured by a sensor connected between the high voltage terminals of the battery and the chassis;

h) comparing the sequence of voltage measurements ($x_{i0}$, $x_{i1}$, $x_{i2}$, ...; $0 \leq i \leq n$) received from the sensor with previously established voltage patterns (P0, P1, P2, ...), wherein each voltage pattern (P0, P1, P2, ...) is formed by a sequence of voltage values ($p_{i0}$, $p_{i1}$, $p_{i2}$, ...; $0 \leq i \leq n$), and wherein each voltage pattern (P0, P1, P2, ...) is associated to an insulation resistance value (Ri; $0 \leq i \leq n$);

i) selecting the voltage pattern (Pi; $0 \leq i \leq n$) whose voltage values ($p_{i0}$, $p_{i1}$, $p_{i2}$, ...; $0 \leq i \leq n$) are closest to the voltage values of the sequence of voltage measurements ($x_{i0}$, $x_{i1}$, $x_{i2}$, ...; $0 \leq i \leq n$) received from the sensor;

j) establishing the insulation resistance value (Ri; $0 \leq i \leq n$) associated to the selected voltage pattern (P0, P1, P2, ...) as the insulation resistance value of the battery; and k) enabling starting of the vehicle if the insulation resistance value obtained exceeds a predetermined insulation resistance threshold value that ensures insulation of the battery.

BRIEF DESCRIPTION OF THE DRAWINGS

For a better comprehension of the invention, the following drawings are provided for illustrative and non-limiting purposes, wherein.

DETAILED DESCRIPTION OF THE INVENTION

Figure 1:
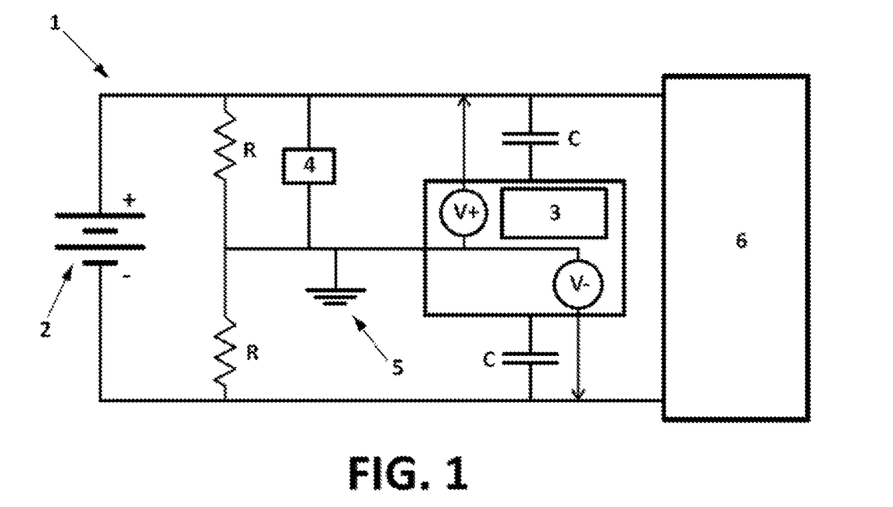
FIG. 1 shows a system for assisting the start of an electrically powered vehicle, when the system is installed in the vehicle.

FIG. 1 shows an electric equivalence of a system 1 for assisting the start of an electrically powered vehicle, when said system 1 is installed in the vehicle. The system 1 comprises a battery 2 for powering the vehicle, and a processing means 3. Preferably, when installed, the system 1 may further comprise a pair of resistors R, a sensor 4 connected between the high voltage terminals of the battery 2 and the vehicle chassis 5, and a load 6. The resistors R shown in FIG. 1 are preferably according to the test procedure TP-305-01. The capacitors C are inherent to the load 6, which represents the engine of charger of the electrically powered vehicle.

According to the present invention, the processing means 3 are configured to: receive a sequence of voltage measurements by a sensor 4, compare said sequence of voltage measurements with pre-established voltage patterns, wherein said patterns are representative of an insulation resistance value, select the voltage pattern closest to the sequence of voltage measurements provided by the sensor 4, establish the insulation resistance value associated to the selected voltage pattern, and enable starting of the vehicle if the insulation resistance value obtained exceeds a predetermined insulation resistance threshold value that ensures insulation of the battery.

Figure 2:
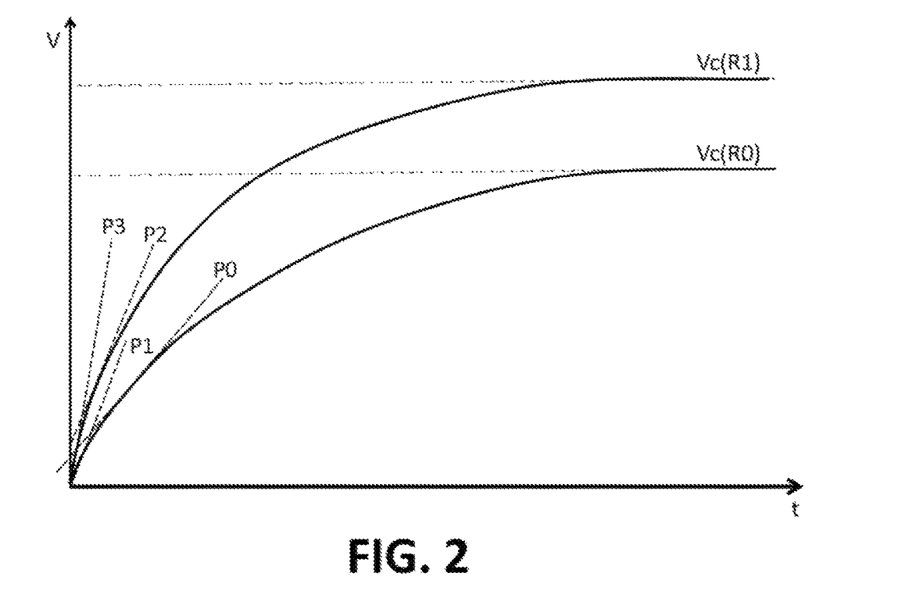
FIG. 2 shows a graphic that represents the temporal voltage behavior of two different sensor measurements, each one corresponding to an insulation resistance value. Also, the figure shows a set of voltage patterns associated to these insulation resistance values.

FIG. 2 shows the potential variation of two different measurements provided by a sensor 4 that senses the resistance between the high voltage terminals of the battery 2 and the chassis 5 of the vehicle. Each curve is formed by a sequence of voltage measurements, which, as shown, have a strong variation at an initial measurement stage and stabilize after a certain period of time.

Figure 3:
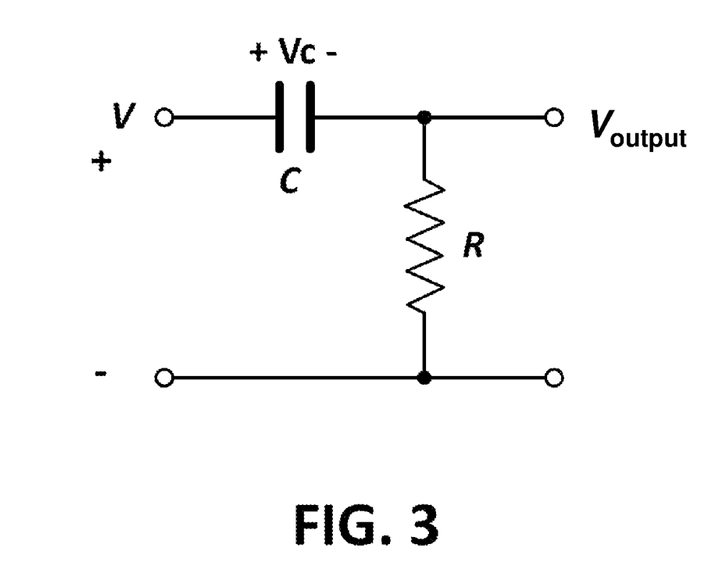
FIG. 3 shows the electric equivalent circuit of the temporal voltage behavior shown in FIG. 2 corresponding to the voltage values received by the sensor.

The voltage values of the sensor 4 correspond to an RC circuit of the kind shown in FIG. 3. Thus, in order to provide a reliable measurement of the insulation resistance, it is required to await stabilization of the curve.

Curves shown in FIG. 2 stabilize at different voltage levels; thus, each curve is associated to a different insulation resistance value, where a first curve Vc (R0) has an insulation resistance value of R0 and a second curve Vc (R1) has an insulation resistance value of R1.

FIG. 2 also shows a plurality of voltage patterns P0, P1, P2, and P3. Each pattern is formed by a sequence of voltage values, which are representative of the initial phase of the temporal variation of the potential measured by the sensor 4 between the high voltage terminals of the battery 2 and the chassis 5. This initial phase usually extends approximately over 10 to 40% of the stabilization time of the potential, preferably over 25% of the stabilization time.

Each sensor measurement, formed by a sequence of voltage measurements, will be compared with each sequence of voltage values that form each voltage pattern. Thus, each pattern represents a possible sensor measurement and, in consequence, a possible result of insulation resistance value. Due to the voltage patterns, the possible sensor measurements are limited and, in the same way, may be standardized. The same occurs with the insulation resistance values since these values are determined by the selection of the voltage pattern. In this way, the invention simplifies obtaining the insulation resistance value.

In the example shown in FIG. 2, patterns P0 and P1 represent the first curve Vc (R0) and patterns P2 and P3 represent the second curve Vc (R1). Thus, when comparing the voltage values of the first curve Vc (R0) with the patterns (P0, P1, P2, and P3), pattern P0 will be selected for being the closest one, while, when comparing the voltage values of the second curve Vc (R1) with the voltage patterns (P0, P1, P2, and P3), pattern P2 will be selected.

According to the invention, once the pattern is selected, the insulation resistance value is obtained. In the represented example, patterns P0 and P1 are associated to R0 since the voltage values of these patterns are more similar to the voltage values of the first curve Vc (R0), and voltage patterns P2 and P3 are associated to R1 since the voltage values of these voltage patterns are more similar to the voltage values of the second curve Vc (R1). Thus, if P0 or P1 were selected, the insulation resistance value obtained would be R0 and, if P2 or P3 were selected, the insulation resistance value obtained would be R1.

For the above mentioned case, the P0 selection results in an insulation resistance value of R0 and the P2 selection results in an insulation resistance value of R1.

In this way, the invention allows determining the insulation resistance value before the sensor reaches the stabilization state. The insulation resistance value is determined by the patterns, which comprise voltage values of the initial ramp of the voltage curves. Preferably, the initial ramp extends approximately over 10 to 40% of the stabilization time of the potential, preferably over 25% of the stabilization time.

Thus, the invention can predict the insulation resistance value associated to sensor measurements from the initial values captured by the sensor.

According to a preferred embodiment, the processing means of the system are further configured to obtain a plurality of voltage patterns, which are representative of temporal variation of the potential between the high voltage terminals of the battery and the chassis for a plurality of predetermined values of load and insulation resistance. Therefore, the invention is capable of generating and using the voltage patterns obtained by the system itself.

Preferably, the processing means are configured to generate a decision tree from a first set of values formed by theoretical temporal variation of potential between the high voltage terminals of the battery and the chassis and a second set of values formed by empirical temporal variation of potential measured by a sensor connected between the high voltage terminals of the battery and the chassis.

Figure 4:
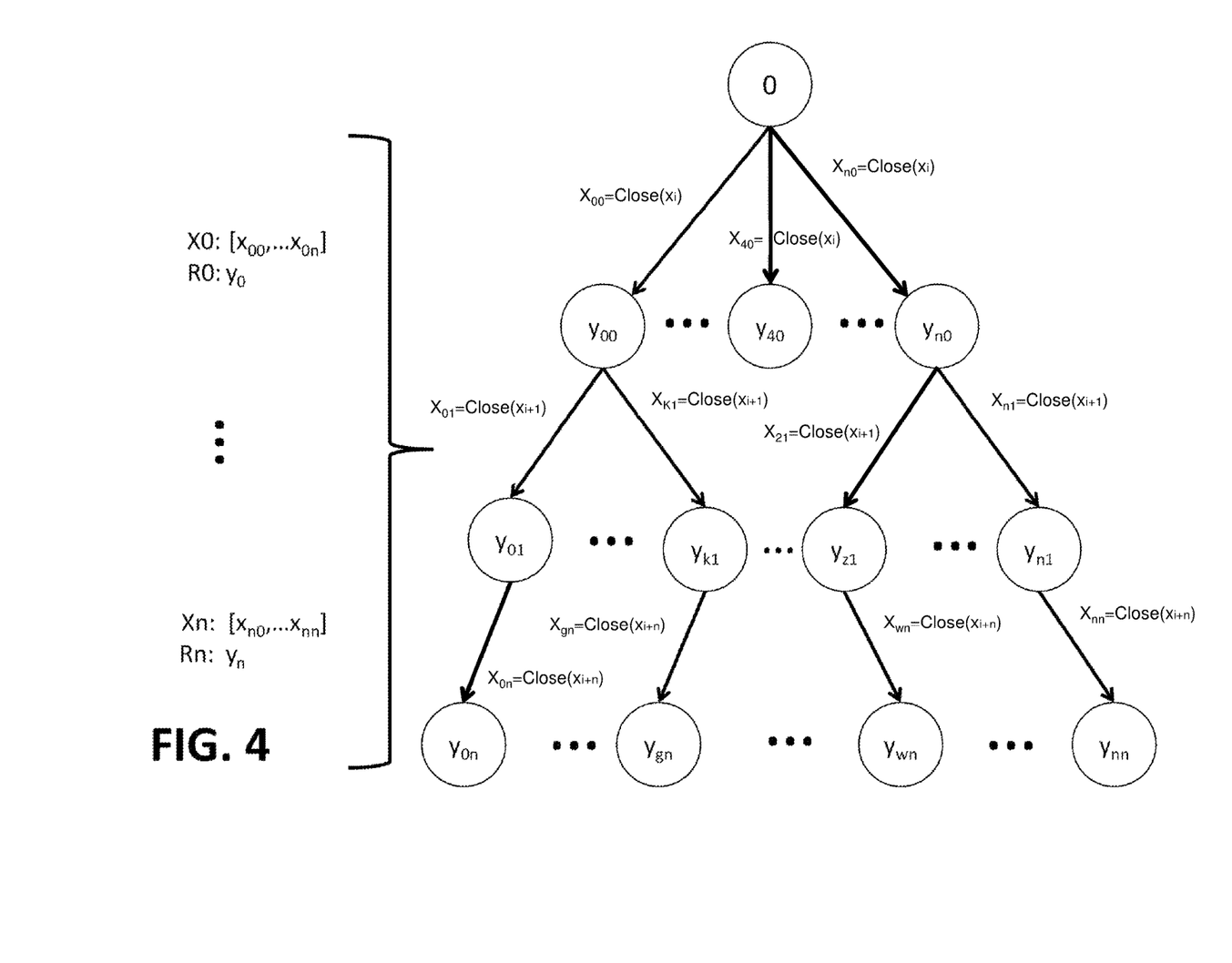
FIG. 4 shows an illustration of the learning mode of a decision tree, which is generated, according to a preferred embodiment of the invention, for comparing the sequence of voltage measurements received from the sensor with the voltage values of each one of the voltage patterns.

FIG. 4 shows a representation of a decision tree in learning mode. In this mode, the decision tree is trained from theoretical and empirical sensor values to obtain the corresponding insulation resistance value in function of the established patterns.

Figure 5:
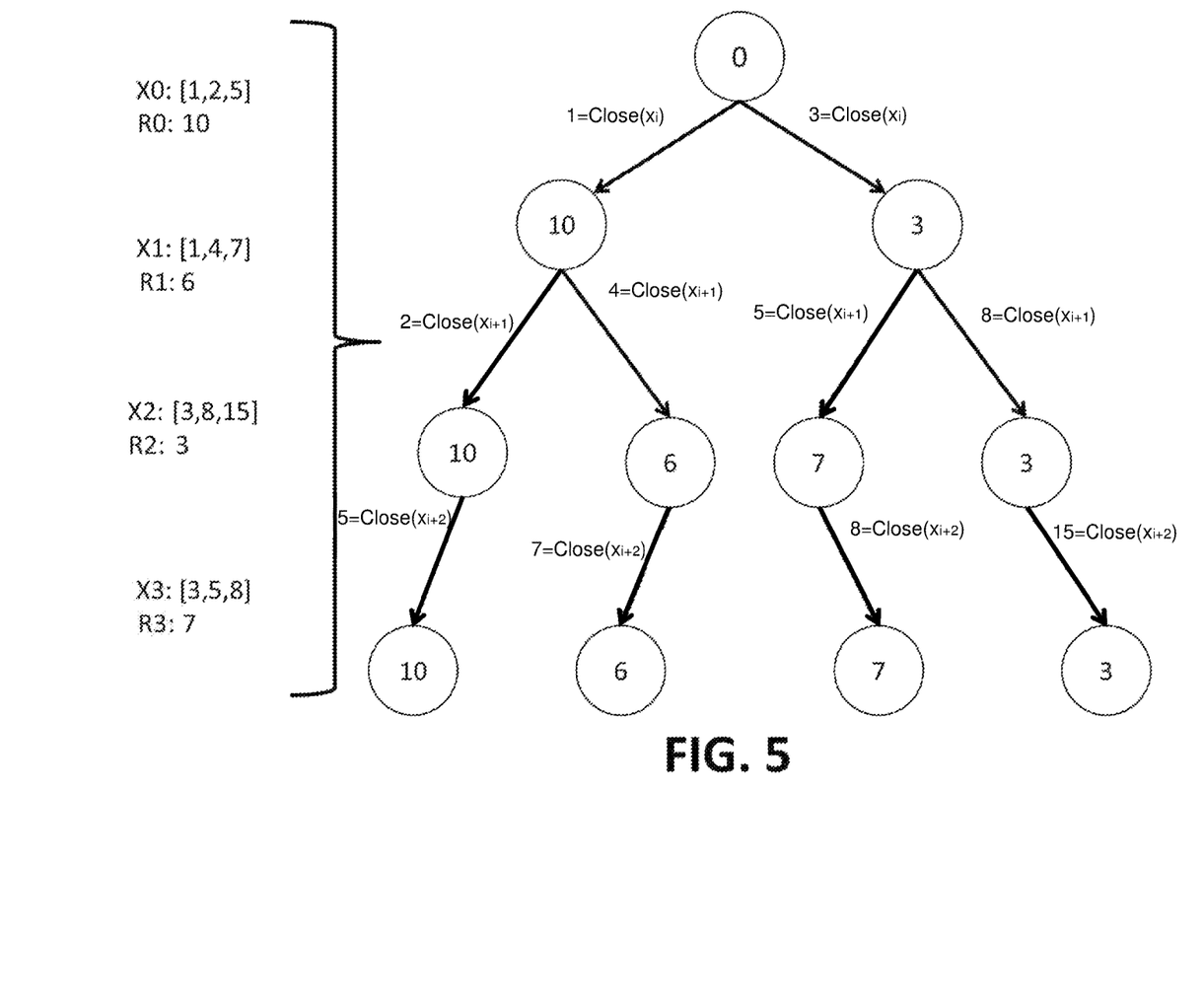
FIG. 5 shows an example of application of the learning mode of the decision tree shown in FIG. 4.

As shown in FIGS. 4 and 5, patterns (P0, P1, P2, . . . ) will be generated from the sequences (X0, X1, X2 . . . ) of voltage measurements ($x_{i0}$, $x_{i1}$, $x_{i2}$, . . . ; 0≤i≤n) received from the sensor and the insulation resistance value (R0, R1, R2 . . . ) corresponding to each sensor measurement. In this manner, patterns are associated to an insulation resistance value such that this insulation resistance value will be known by selecting a pattern.

As shown in FIG. 5, from each sequence (X0, X1, X2 . . . ) of voltage measurements ($x_{i0}$, $x_{i1}$, $x_{i2}$, . . . ; 0≤i≤2) and its correspondent insulation resistance (R0, R1, R2 . . . ), a pattern (P0, P1, P2, . . . ) and an insulation resistance value will be created. That is, X0=[2, 5]; R0=10→P0=[1, 2, 5]; R0=10
X1=[1, 4, 7]; R1=6→P1=[1, 4, 7]; R1=6
X2=[3, 8, 15]; R2=3→P2=[3, 8, 15]; R2=3
X3=[3, 5, 8]; R3=7→P3=[3, 5, 8]; R3=7

Once the decision tree is created by theoretical values of both the sensor values and the insulation resistance, the tree is trained with empirical values until a desired error is obtained. This error depends on the size of the tree, the quality of the learning process and some other factors. The size of the tree will be limited since patterns only correspond to the initial ramp of the sensor voltage curves.

Once the decision tree is generated, it can be applied when comparing the sequence of voltage measurements ($x_{i0}$, $x_{i1}$, $x_{i2}$, . . . ; 0≤i≤n) received from the sensor with each one of the voltage patterns (P0, P1, P2, . . . ).

Figure 6:
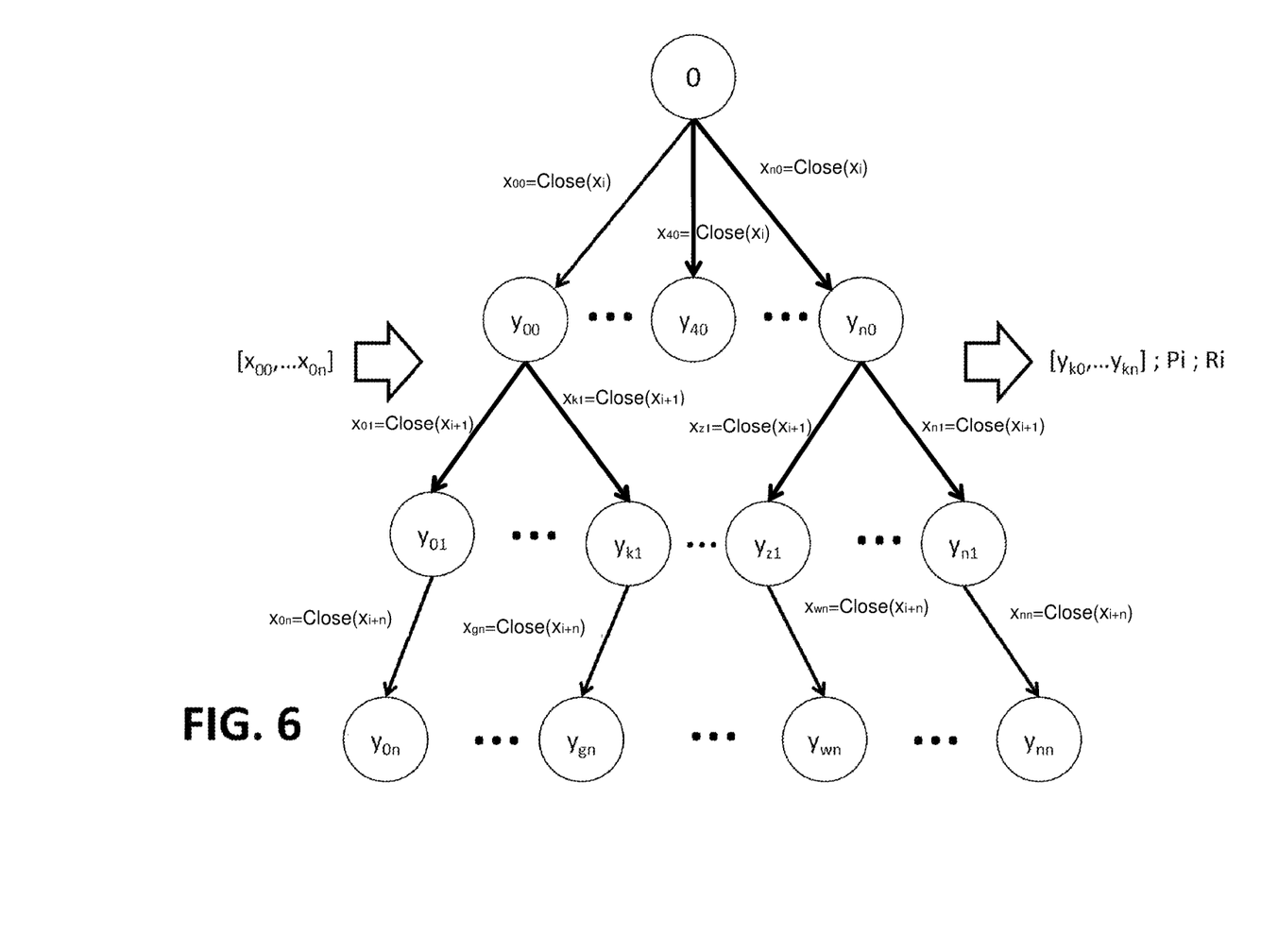
FIG. 6 shows an illustration of the execution mode of the decision tree generated according to a preferential embodiment of the invention.

FIG. 6 shows a representation of a decision tree in execution mode. In this mode, the system is capable of selecting the closest pattern to the sensor voltage measures and, as a result, of obtaining the insulation resistance value.

Figure 7:
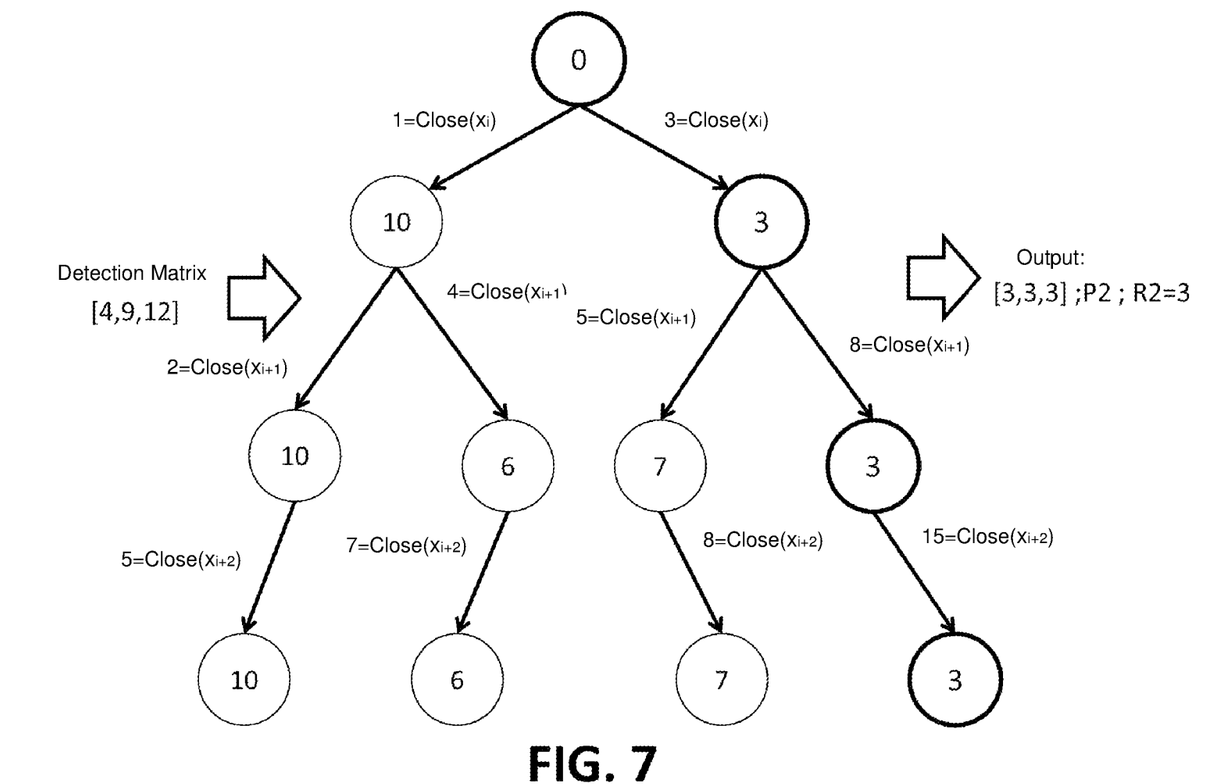
FIG. 7 shows an example of application of the execution mode of the decision tree shown in FIG. 5.

FIG. 7 shows an example of the execution mode of the decision tree of FIG. 5. The sequence of voltage measurements received by the sensor [4, 9 12] are compared to the values of the branches of the tree. The values of the branches correspond to the values of the patterns. Thus, [4, 9, 12] is compared to P0=[1, 2, 5], P1=[1, 4, 7], P2=[3, 8, 15] and P3=[3, 5, 8]. After that, P2 will be selected for being the closest and the insulation resistance value associate will be easily obtained, R=3.

According to a preferred embodiment, the voltage measurements ($x_{i0}$, $x_{i1}$, $x_{i2}$, . . . ; 0≤i≤n) and the voltage values ($p_{i0}$, $p_{i1}$, $p_{i2}$, . . . ; 0≤i≤n) correspond to instantaneous values of voltage.

Alternatively, in another preferred embodiment, the voltage measurements ($x_{i0}$, $x_{i1}$, $x_{i2}$, . . . ; 0≤i≤n) and the voltage values ($p_{i0}$, $p_{i1}$, $p_{i2}$, . . . ; 0≤i≤n) correspond to the derivative of the instantaneous values of voltage.

Alternatively, in another preferred embodiment, the voltage measurements ($x_{i0}$, $x_{i1}$, $x_{i2}$, . . . ; 0≤i≤n) and the voltage values ($p_{i0}$, $p_{i1}$, $p_{i2}$, . . . ; 0≤i≤n) correspond to the average or RMS of the instantaneous values of voltage.

Once the insulation resistance value is obtained, the processing means compare the value with a predetermined insulation resistance threshold value. In a preferred embodiment, the predetermined insulation resistance threshold value is in the range of 5 Ω/V to 100 Ω/V. This predetermined insulation resistance threshold value ensures the battery insulation. Thus, if the insulation resistance value obtained exceeds said predetermined insulation resistance threshold value, the system ensures insulation of the battery and, in consequence, a safe start of the vehicle.

The invention claimed is:

1. System for assisting the start of an electrically powered vehicle, comprising:
   a battery for powering the vehicle, and
   a processing means, the processing means configured to:
   a) receive a sequence of voltage measurements ($x_{i0}$, $x_{i1}$, $x_{i2}$, . . . ; 0≤i≤n) by a sensor connected between the high voltage terminals of the battery and a vehicle chassis;
   b) compare the sequence of voltage measurements ($x_{i0}$, $x_{i1}$, $x_{i2}$, . . . ; 0≤i≤n) received from the sensor with a preprogrammed plurality of voltage patterns (P0, P1, P2, . . . ), wherein each voltage pattern of the plurality of voltage patterns (P0, P1, P2, . . . ) is formed by a sequence of voltage values ($p_{i0}$, $p_{i1}$, $p_{i2}$, . . . ; 0≤i≤n), and wherein each voltage pattern of the preprogrammed plurality of voltage patterns (P0, P1, P2, . . . ) is associated to an insulation resistance value (Ri; 0≤i≤n);
   c) select a voltage pattern (Pi; 0≤i≤n) of the preprogrammed plurality of voltage patterns whose voltage values ($p_{i0}$, $p_{i1}$, $p_{i2}$, . . . ; 0≤i≤n) are closest to the voltage values of the sequence of voltage measurements ($x_{i0}$, $x_{i1}$, $x_{i2}$, . . . ; 0≤i≤n) received from the sensor;
   d) establish the insulation resistance value (Ri; 0≤i≤n) associated to the selected voltage pattern of the preprogrammed plurality of voltage patterns (P0, P1, P2, . . . ) as the insulation resistance value of the battery; and
   e) enable starting of the vehicle if the insulation resistance value obtained exceeds a predetermined insulation resistance threshold value that ensures insulation of the battery, wherein the predetermined insulation resistance threshold value ranges from 5 Ω/V to 100 Ω/V.

2. System according to claim 1, wherein the processing means are further configured to:
   f) obtain the preprogrammed plurality of voltage patterns representative of temporal variation of the potential between the high voltage terminals of the battery and the chassis for a plurality of predetermined values of load and insulation resistance.

3. System according to claim 2, wherein the processing means are configured to generate a decision tree from a first set of values formed by theoretical temporal variation of potential between the high voltage terminals of the battery and the chassis, and a second set of values formed by empirical temporal variation of potential measured by a sensor connected between the high voltage terminals of the battery and the chassis.

4. System according to claim 3, wherein the processing means are configured to generate the decision tree by a subset of the first and the second set of values, and wherein the number of values of any of the subset determines the number of levels of the decision tree.

5. System according to claim 3, wherein the processing means are configured to apply the generated decision tree when comparing the sequence of voltage measurements ($x_{i0}$, $x_{i1}$, $x_{i2}$, . . . ; 0≤i≤n) received from the sensor with the preprogrammed plurality of voltage patterns (P0, P1, P2, . . . ).

6. System according to claim 1, wherein the voltage measurements ($x_{i0}$, $x_{i1}$, $x_{i2}$, . . . ; 0≤i≤n) and the voltage values ($p_{i0}$, $p_{i1}$, $p_{i2}$, . . . ; 0≤i≤n) correspond to instantaneous values of voltage.

7. System according to claim 1, wherein the voltage measurements ($x_{i0}$, $x_{i1}$, $x_{i2}$, . . . ; 0≤i≤n) and the voltage values ($p_{i0}$, $p_{i1}$, $p_{i2}$, . . . ; 0≤i≤n) correspond to the derivative of instantaneous values of voltage.

8. System for assisting the start of an electrically powered vehicle comprising:
   a battery for powering the vehicle, and
   a processing means, the processing means configured to:
   a) receive a sequence of voltage measurements ($x_{i0}$, $x_{i1}$, $x_{i2}$, . . . ; 0≤i≤n) by a sensor connected between the high voltage terminals of the battery and a vehicle chassis;
   b) compare the sequence of voltage measurements ($x_{i0}$, $x_{i1}$, $x_{i2}$, . . . ; 0≤i≤n) received from the sensor with a preprogrammed plurality of voltage patterns (P0, P1, P2, . . . ), wherein each voltage pattern of the plurality of voltage patterns (P0, P1, P2, . . . ) is formed by a sequence of voltage values ($p_{i0}$, $p_{i1}$, $p_{i2}$, . . . ; 0≤i≤n), and wherein each voltage pattern of the preprogrammed plurality of voltage patterns (P0, P1, P2, . . . ) is associated to an insulation resistance value (Ri; 0≤i≤n);
   c) select a voltage pattern (Pi; 0≤i≤n) of the preprogrammed plurality of voltage patterns whose voltage values ($p_{i0}$, $p_{i1}$, $p_{i2}$, . . . ; 0≤i≤n) are closest to the voltage values of the sequence of voltage measurements ($x_{i0}$, $x_{i1}$, $x_{i2}$, . . . ; 0≤i≤n) received from the sensor;
   d) establish the insulation resistance value (Ri; 0≤i≤n) associated to the selected voltage pattern of the preprogrammed plurality of voltage patterns (P0, P1, P2, . . . ) as the insulation resistance value of the battery; and
   e) enable starting of the vehicle if the insulation resistance value obtained exceeds a predetermined insulation resistance threshold value that ensures insulation of the battery, wherein the voltage measurements ($x_{i0}$, $x_{i1}$, $x_{i2}$, . . . ; 0≤i≤n) and the voltage values ($p_{i0}$, $p_{i1}$, $p_{i2}$, . . . ; 0≤i≤n) correspond to the average or RMS of instantaneous values of voltage.

9. System for assisting the start of an electrically powered vehicle, comprising:
   a battery for powering the vehicle;
   a sensor connected between the high voltage terminals of the battery and a vehicle chassis, wherein the sensor has an initial ramp state and a stabilization state; and
   a processing means, the processing means configured to:
   a) receive a sequence of voltage measurements ($x_{i0}$, $x_{i1}$, $x_{i2}$, . . . ; 0≤i≤n) from the sensor when in the initial ramp state,
   b) compare the sequence of voltage measurements ($x_{i0}$, $x_{i1}$, $x_{i2}$, . . . ; 0≤i≤n) received from the sensor with a previously established plurality of voltage patterns (P0, P1, P2, . . . ), wherein each voltage pattern of the plurality of voltage patterns (P0, P1, P2, . . . ) is formed by a sequence of voltage values ($p_{i0}$, $p_{i1}$, $p_{i2}$, . . . ; 0≤i≤n), and wherein each voltage pattern of the plurality of voltage patterns (P0, P1, P2, . . . ) is associated to an insulation resistance value (Ri; 0≤i≤n),
   c) select a voltage pattern (Pi; 0≤i≤n) of the plurality of voltage patterns whose voltage values ($p_{i0}$, $p_{i1}$, $p_{i2}$, . . . ; 0≤i≤n) are closest to the voltage values of the sequence of voltage measurements ($x_{i0}$, $x_{i1}$, $x_{i2}$, . . . ; 0≤i≤n) received from the sensor,
   d) establish the insulation resistance value (Ri; 0≤i≤n) associated to the selected voltage pattern (P0, P1, P2, . . . ) as the insulation resistance value of the battery, and
   e) enable electrically energizing a load indicative of vehicle start if the insulation resistance value obtained exceeds a predetermined insulation resistance threshold value that ensures insulation of the battery.

10. The system set forth in claim 9, wherein the initial ramp state extends over a period that is less than forty percent of a stabilization period associated with a voltage curve of the sensor.

\* \* \* \* \*